(12) United States Patent
Yoshikawa et al.

(10) Patent No.: US 9,894,271 B2
(45) Date of Patent: Feb. 13, 2018

(54) PATTERN INSPECTION APPARATUS AND PATTERN INSPECTION METHOD

(71) Applicant: TOSHIBA MEMORY CORPORATION, Tokyo (JP)

(72) Inventors: Ryoji Yoshikawa, Kanagawa (JP); Tatsuhiko Higashiki, Kanagawa (JP); Seiji Morita, Tokyo (JP); Takashi Hirano, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 142 days.

(21) Appl. No.: 14/847,949

(22) Filed: Sep. 8, 2015

(65) Prior Publication Data
US 2016/0275365 A1    Sep. 22, 2016

(30) Foreign Application Priority Data

Mar. 16, 2015  (JP) ................. 2015-052147

(51) Int. Cl.
| | |
|---|---|
| *G06F 17/50* | (2006.01) |
| *H04N 5/232* | (2006.01) |
| *G06T 7/00* | (2017.01) |
| *H01L 21/66* | (2006.01) |
| *G06T 3/40* | (2006.01) |

(52) U.S. Cl.
CPC .......... *H04N 5/23229* (2013.01); *G06T 3/40* (2013.01); *G06T 7/001* (2013.01); *H01L 22/00* (2013.01); *G06T 2207/10061* (2013.01); *G06T 2207/30148* (2013.01)

(58) Field of Classification Search
USPC ........................................ 716/51
See application file for complete search history.

(56) References Cited

U.S. PATENT DOCUMENTS

| | | | |
|---|---|---|---|
| 8,294,889 B2 | 10/2012 | Kashiwagi et al. | |
| 2002/0117635 A1* | 8/2002 | Shinada ............... | G01N 23/225 250/492.3 |
| 2005/0204327 A1 | 9/2005 | Mukai et al. | |
| 2006/0104500 A1* | 5/2006 | Obara ................. | G01N 21/9501 382/145 |
| 2014/0232032 A1 | 8/2014 | Yoshikawa et al. | |

FOREIGN PATENT DOCUMENTS

JP    2002-14459    1/1820

OTHER PUBLICATIONS

Morita et al., "New Inspection Technology for Observing Nanometer Size Defects Using Expansion Soft Template", SPIE Proceedings vol. 9050: Metrology, Inspection, and Process Control for Microlithography XXVIII, (editors: Cain et al.), 5 pages, (2014).

\* cited by examiner

*Primary Examiner* — Bryce Aisaka
(74) *Attorney, Agent, or Firm* — Finnegan, Henderson, Farabow, Garrett & Dunner, L.L.P.

(57) ABSTRACT

A pattern inspection apparatus according to an embodiment includes an image capture and an output part. The image capture captures an image of a second pattern of an inspection target object obtained by enlarging the inspection target object having a first pattern. The output part outputs position information of the first or second pattern corresponding to divergent portions between a reference data generated from design data of the first pattern and a captured data generated by the image capture, other than prediction positions of first defects occurring when the inspection target object is enlarged.

19 Claims, 10 Drawing Sheets

PATTERN INSPECTION APPARATUS AND PATTERN INSPECTION METHOD

CROSS REFERENCE TO RELATED APPLICATIONS

This application is based upon and claims the benefit of priority from the prior Japanese Patent Application No. 2015-052147, filed on Mar. 16, 2015, the entire contents of which are incorporated herein by reference.

FIELD

The embodiments of the present invention relate to a pattern inspection apparatus and a pattern inspection method.

BACKGROUND

A nanoimprint technology has been developed to form fine patterns in a semiconductor device or the like. In the nanoimprint technology, an original plate (a master template) is pressed against a transfer target object, thereby transferring patterns of the original plate onto the transfer target object at the real scale. Therefore, with downscaling of the semiconductor device, the patterns of the original plate are also downscaled. Defects in the patterns of the original plate downscaled in this way are difficult to be detected even with short-wavelength light such as DUV (Deep UV). An inspection using an electron beam takes a longer time than an optical inspection.

To detect defects in fine patterns of an original plate, a method using an expansion resin material is therefore examined. In this method, an expansion resin material is pressed against an original plate, thereby transferring patterns of the original plate onto the expansion resin material. The expansion resin material is then expanded or stretched to enlarge the patterns transferred onto the expansion resin material. Defects in the patterns of the original plate can be detected by performing an optical inspection onto the patterns enlarged in this way.

However, when the expansion resin material is expanded or stretched, new defects may occur in the patterns transferred onto the expansion resin material. If there are many novel defects not having been included in the original plate but having newly occurred in the expansion resin material, detection of the defects in the patterns of the original plate becomes difficult.

DETAILED DESCRIPTION

Embodiments will now be explained with reference to the accompanying drawings. The present invention is not limited to the embodiments.

A pattern inspection apparatus according to an embodiment includes an image capture and an output part. The image capture captures an image of a second pattern of an inspection target object obtained by enlarging the inspection target object having a first pattern. The output part outputs position information of the first or second pattern corresponding to divergent portions between a reference data generated from design data of the first pattern and a captured data generated by the image capture, other than prediction positions of first defects occurring when the inspection target object is enlarged.

First Embodiment

Figure 1:
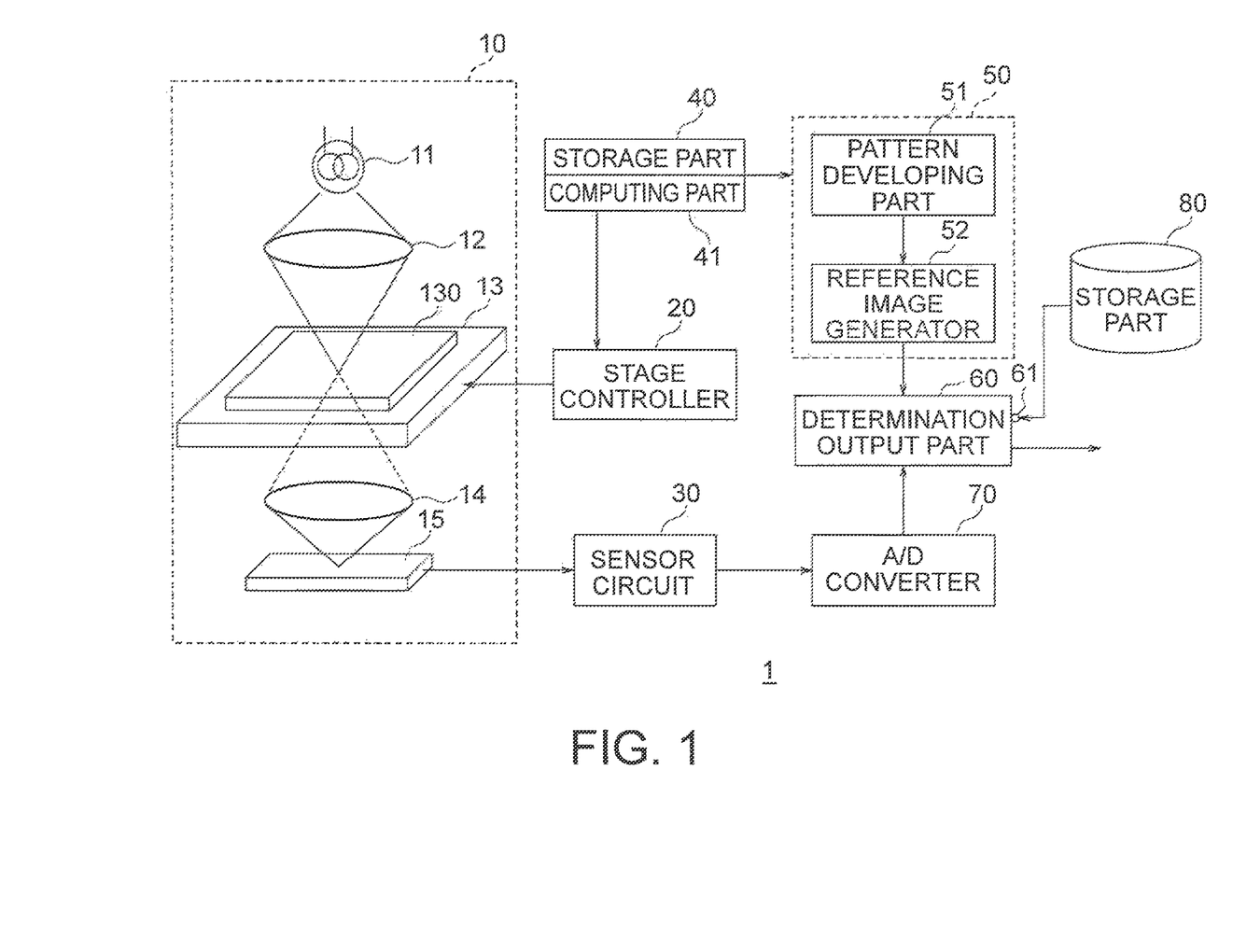
FIG. 1 is a block diagram showing an example of a configuration of a pattern inspection apparatus 1 according to a first embodiment.

FIG. 1 is a block diagram showing an example of a configuration of a pattern inspection apparatus 1 according to a first embodiment. The pattern inspection apparatus 1 includes an image capture 10, a stage controller 20, a sensor circuit 30, a storage part 40, a computing part 41, a generator 50, a determination output part 60, an A/D converter 70, and a storage part 80.

The image capture 10 includes a light source 11, a condenser lens 12, an XY stage 13, an objective lens 14, and an image sensor 15. The image capture 10 captures an image of patterns of an enlarged copy template 130 mounted on the XY stage 13 to generate a captured image. The enlarged copy template 130 is a template enlarged by stretching or expanding a copy template 120 as explained with reference to FIGS. 5 and 6.

The light source 11 is a mercury lamp, an argon laser, or the like. The XY stage 13 is capable of having the enlarged copy template 130 mounted thereon and can move the enlarged copy template 130 in directions of horizontal two axes (XY directions). The XY stage 13 is controlled by the stage controller 20.

The image sensor 15 is, for example, a CCD (Charge Coupled Device) sensor in which CCDs are arrayed one-dimensionally or two-dimensionally. A pattern image of the enlarged copy template 130 is enlarged, for example, several hundred times by an optical system including the condenser lens 12, the objective lens 14, and the like and is imaged on the image sensor 15.

When a photo-detection area of the image sensor 15 is small, the image sensor 15 can capture a pattern image of the entire enlarged copy template 130 by relatively moving (scanning) the enlarged copy template 130 in the X direction and the Y direction with respect to the image sensor 15. The image sensor 15 outputs the pattern image of the enlarged copy template 130 to the sensor circuit 30. While FIG. 1 shows an example using transmitted light, reflected light or a mixture of transmitted light and reflected light can be used according to characteristics of the enlarged copy template 130.

The stage controller 20 obtains coordinates indicating a destination of the XY stage 13 from the storage part 40 and controls the operation of the XY stage 13.

The sensor circuit 30 outputs an optical image (a captured image) corresponding to the pattern image output from the image sensor 15. A pixel size of the captured image is, for example, 50 nanometers×50 nanometers. The sensor circuit 30 outputs the captured image to the A/D converter 70.

The A/D converter 70 performs analog-digital conversion (A/D conversion) of the captured image and outputs the resultant data to the determination output part 60. The A/D-converted captured image has binary or multivalued gradation data in pixel units. The gradation data is data that represents a color strength or brightness with a binary or multivalued digital value. Alternatively, the A/D converter 70 can A/D-convert the captured image in units of blocks each including a plurality of pixels.

The storage part 40 has coordinates indicating destinations of the XY stage 13, design data of concave and convex patterns of a master template (100 in FIG. 2), and the like stored therein. The design data is created, for example, by CAD (Computer-Aided Design).

The generator 50 includes a pattern developing part 51 and a reference image generator 52. The pattern developing part 51 receives the design data of the concave and convex patterns of the master template from the storage part 40 and develops the design data into data in units of pixels of the image sensor 15. Development is processing of delimiting the design data in units of pixels having a resolution nearly equal to that of the image sensor 15. When the captured image is A/D-converted in units of blocks each including plural pixels, development is processing of delimiting the design data in units of blocks.

The reference image generator 52 converts the design data developed by the pattern developing part 51 into multivalued gradation data having a resolution nearly equal to that of the image sensor 15. For example, when the captured image is binary, the reference image generator 52 converts the design data into binary gradation data. For example, when the design data is developed in units of pixels, the reference image generator 52 generates the gradation data in units of pixels. When the design data is developed in units of blocks, the reference image generator 52 generates the gradation data in units of blocks.

The reference image generator 52 also performs filtering processing and the like to the design data developed and converted into the multivalued gradation data, to generate a reference image that can be compared with the captured image. The filtering processing is performed in consideration of optical characteristics and shape changes caused by an etching process of forming the concave and convex patterns on the master template and the like. The pixel size or the number of pixels in each of the blocks of the reference image is the same as that of the captured image.

In the first embodiment, the generator 50 generates the reference image from the design data. However, the reference image corresponding to the design data can be previously stored in the storage part 40 and read from the storage part 40. Alternatively, the reference image can be input from outside of the pattern inspection apparatus 1 to the determination output part 60 via an input part 61.

The reference image and the captured image are formed by digital data which is converted to be comparable with each other. Therefore, the words of "image(s)" recited herein are digital data, practically, and are compared in conditions of digital data.

The determination output part 60 serving as an output part compares the captured image received from the A/D converter 70 with the reference image generated by the generator 50 and generates a difference image between the captured image and the reference image. The difference image is an image indicating a difference between luminance of each of regions (pixels) in the captured image and luminance of each of regions (pixels) in the reference image corresponding thereto. The determination output part 60 determines whether there are pattern defects based on the difference image. That is, the determination output part 60 determines divergent portions between the captured image and the reference image as defects in the patterns of the master template 100.

At this time, the determination output part 60 obtains from the storage part 80 prediction positions of first defects (hereinafter, also "novel defects") in the patterns occurring when the copy template 120 is enlarged. The determination output part 60 determines the divergent portions (inconsistent portions) between the captured image and the reference image other than the prediction positions of the novel defects as pattern defects of the master template 100. That is, the determination output part 60 eliminates coordinates of the novel defects that are predicted to occur due to enlargement of the copy template 120 from the divergent portions between the captured image and the reference image. In this way, the determination output part 60 outputs coordinates (position information) of the divergent portions between the captured image and the reference image except for the coordinates of the prediction positions of the novel defects as coordinates of the defects in the master template 100. The position information of the divergent portions can be coordinates in the patterns of the master template 100 or coordinates in the enlarged patterns of the enlarged copy template 130.

The storage part 80 has the coordinates of the prediction positions of the novel defects in the enlarged copy template 130 stored therein. In the first embodiment, the storage part 80 can be incorporated into the pattern inspection apparatus 1. The storage part 80 can be alternatively provided outside of the pattern inspection apparatus 1.

In this case, the coordinates of the prediction positions of the defects in the enlarged copy template 130 are input from outside of the pattern inspection apparatus 1 to the determination output part 60 via the input part 61.

The prediction positions of the novel defects in the enlarged copy template 130 are obtained by performing an elastic deformation simulation or a plastic deformation simulation. For example, the prediction positions are obtained using a deformation simulation according to a rigid plastic finite element method. By using the simulation mentioned above, the novel defects occurring in the enlarged copy template 130 can be predicted based on the enlargement ratio of the enlarged copy template 130, the shapes of the patterns in the design data of the master template 100, the density of the patterns, and the like. The prediction positions of the novel defects in the enlarged copy template 130 differ depending on the patterns transferred onto the copy template 120. Therefore, the prediction positions of the novel defects are obtained by performing the simulation mentioned above with respect to each piece of design data of the patterns and are registered in the prediction-position storage part 80. When the positions of the novel defects are statistically known, the prediction positions of the novel defects obtained by the simulation can be modified based on the statistics.

The generator 50 and the determination output part 60 repeatedly perform the same data processing in units of pixels or in units of blocks. Therefore, the generator 50 and the determination output part 60 can be realized using a logic circuit such as an ASIC (Application Specific Integrated Circuit). This enables the generator 50 and the determination output part 60 to achieve generation of the reference image and determination of defects at a high speed. Needless to say, the generator 50 and the determination output part 60 can perform the data processing using a general CPU and software.

Creation of the copy template 130 is explained next.

Figure 2:
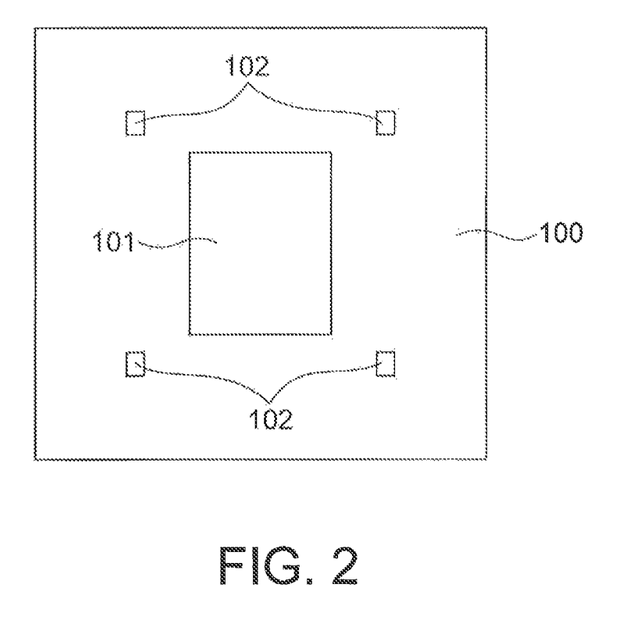
FIG. 2 shows an example of a layout of a lithography original plate 100.

FIG. 2 shows an example of a layout of a lithography original plate 100. The lithography original plate 100 includes a main pattern 101 and a plurality of alignment marks 102. The lithography original plate 100 is obtained, for example, by forming concave and convex patterns (the main pattern 101 and the alignment marks 102) serving as first patterns on one surface of an entirely-transparent quartz substrate through plasma etching.

The main pattern 101 has, for example, a fine concave and convex pattern equal to or smaller than about 10 nanometers. The alignment marks 102 can be a pattern dedicatedly arranged or can be a device pattern included in the main pattern 101. For example, the alignment marks 102 are arranged at four corners of the lithography original plate 100.

The lithography original plate 100 is, for example, a template used for imprint processing or a photomask used for lithography processing. In the first embodiment, the lithography original plate 100 is a template (hereinafter, "master template") used for the imprint processing. The first embodiment is applicable not only to detection of defects in patterns of the lithography original plate used in a semiconductor process technique but also to detection of defects in an arbitrary material having patterns.

Figure 3:
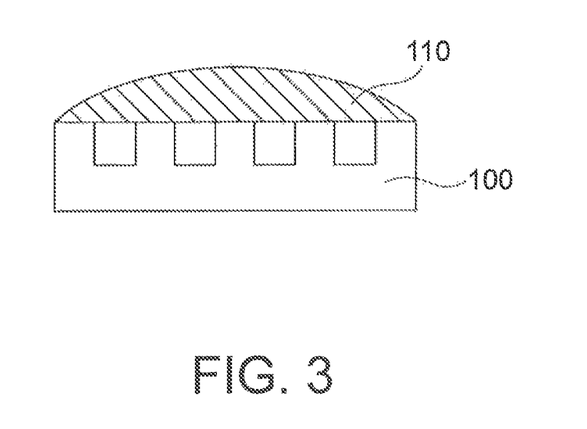
FIGS. 3 to 6 are cross-sections showing a forming method of an enlarged copy template 130.

First, as shown in FIG. 3, a liquid resin 110 is coated on a pattern surface of the master template 100. The liquid resin 110 is filled in the concave and convex patterns of the master template 100 by a capillary action. The liquid resin 110 used in this example contains a pattern transfer component, a pattern retention component, and a stretching component. These components are explained later.

Figure 4:
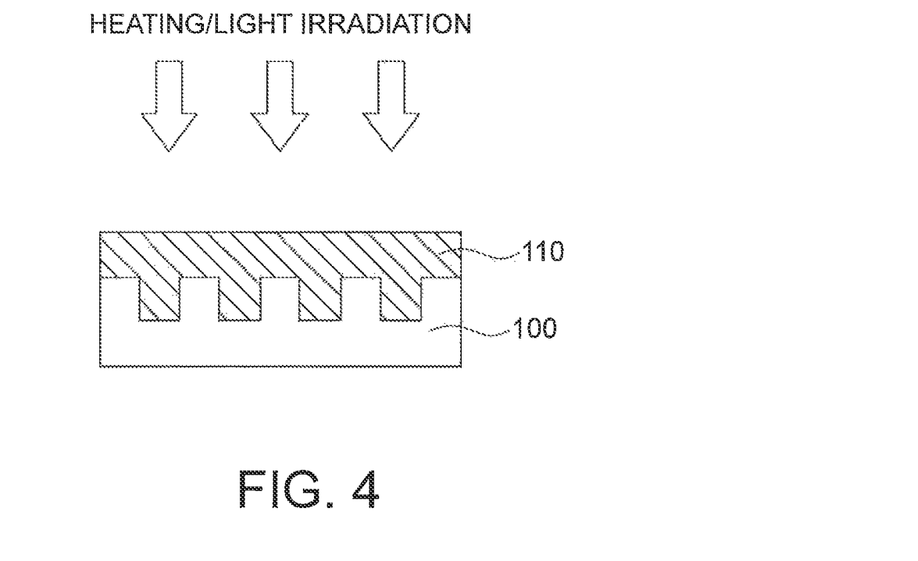

Next, after the liquid resin 110 is filled in the concave and convex patterns of the master template 100, light irradiation or heating is performed onto the liquid resin 110 as shown in FIG. 4. This causes the liquid resin 110 to cure. In the case of light irradiation, ultraviolet light is irradiated, for example.

Figure 5:
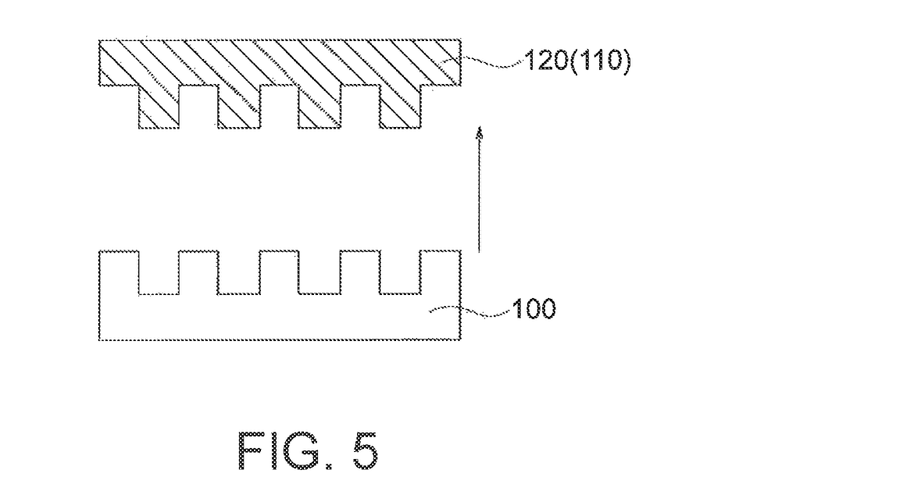

Subsequently, the cured liquid resin 110 is demolded from the master template 100 as shown in FIG. 5. Accordingly, the copy template 120 formed of the cured liquid resin 110 is obtained. Because the liquid resin 110 contains the pattern transfer component, the fine concave and convex patterns (the first patterns) of the master template 100 are transferred onto the copy template 120. The pattern transfer component is, for example, a liquid silicone resin and a silicon polymer, a silsesquioxane, or the like can be used therefor.

Figure 6:
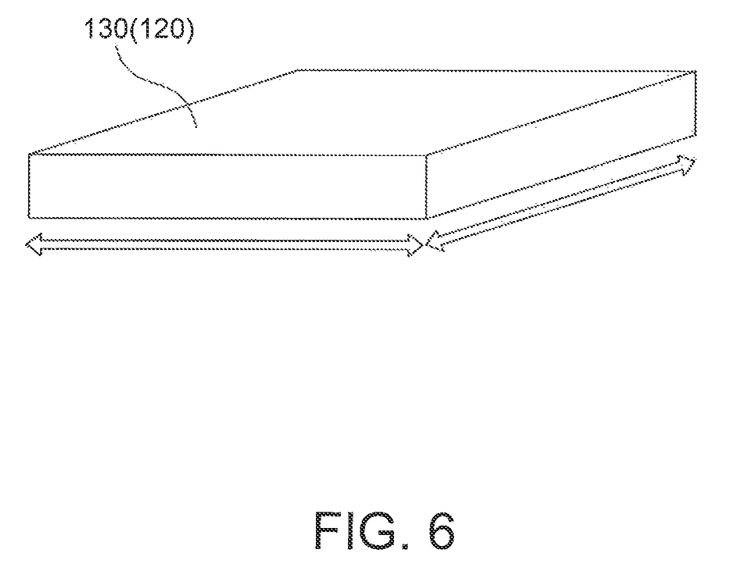

Next, as shown in FIG. 6, the copy template 120 is heated and stretched. Heating is performed to such an extent that the copy template 120 is softened and that the shapes of the concave and convex patterns of the copy template 120 are not deformed. The concave and convex patterns are not shown in FIG. 6.

Because the material (the liquid resin 110) of the copy template 120 contains the stretching component, the copy template 120 is expanded and enlarged by stretching. In this way, the enlarged copy template 130 as an inspection target object is obtained. The material (the liquid resin 110) of the copy template 120 also contains the pattern retention component and thus the concave and convex patterns keep the shapes without being deformed even when the copy template 120 is heated and stretched. For example, the copy template 120 is enlarged 1.5 or more times, thereby obtaining the enlarged copy template 130.

As the stretching component, a thermoplastic resin such as PMMA (polymethyl methacrylate), PE (polyethylene), PP (polypropylene), PVA (polyvinyl alcohol), PA (polyamide), or POM (polyoxymethylene) can be used.

As the pattern retention component, a thermoplastic setting resin such as COP (cyclo olefin polymer), PC (polycarbonate), PS (polystyrene), PET (polyethylene terephthalate), AS (acrylonitrile styrene), or ABS (acrylonitrile butadiene styrene) can be used.

The copy template 120 and the enlarged copy template 130 can have stacked structures, respectively. For example, the copy template 120 and the enlarged copy template 130 can include a base layer containing the stretching component and a pattern transfer layer provided on the base layer and containing the pattern retention component, respectively.

The enlarged copy template 130 can be formed by stretching the copy template 120 in one direction or in two directions orthogonal to each other in the plane including the concave and convex patterns of the copy template 120. Alternatively, the enlarged copy template 130 can be formed by stretching the copy template 120 in three or more directions. When the copy template 120 is stretched in plural directions, the copy template 120 can be stretched in the plural directions at the same time or in one direction at a time. Further, the copy template 120 can be stretched in all directions, equally, in the plane including the concave and convex patterns of the copy template 120 by being rotated while heated.

Figure 7A:
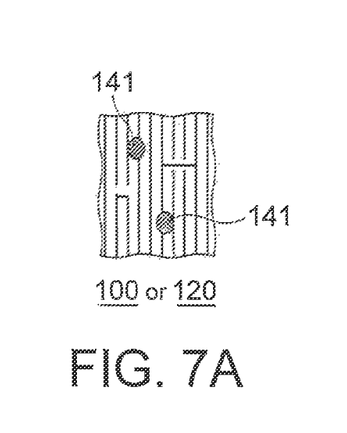
FIG. 7A is a plan view showing concave and convex patterns transferred onto the copy template 120 or the enlarged copy template 130.
Figure 7B:
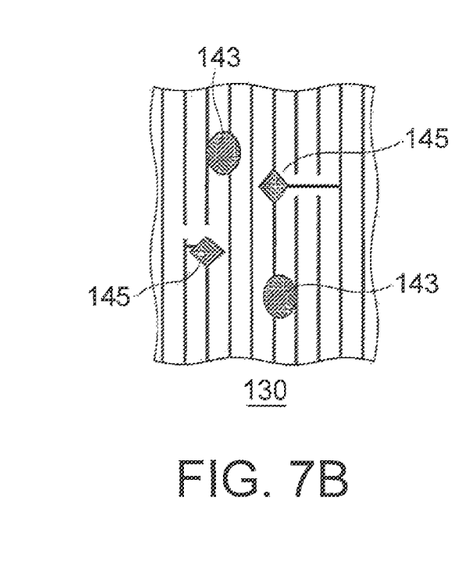
FIG. 7B is a plan view showing enlarged concave and convex patterns of the enlarged copy template 130.
Figure 7C:
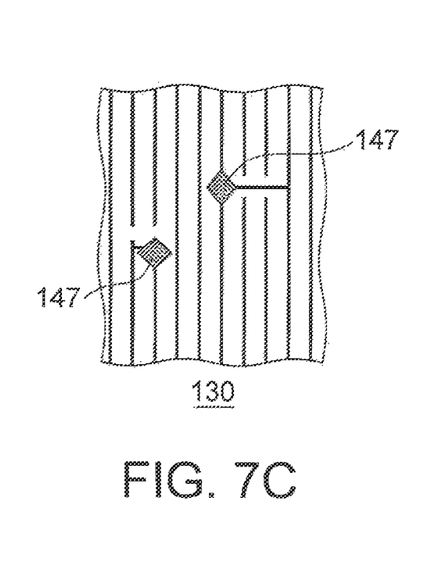
FIG. 7C is a plan view showing prediction positions of novel defects in the enlarged copy template 130.
Figure 7D:
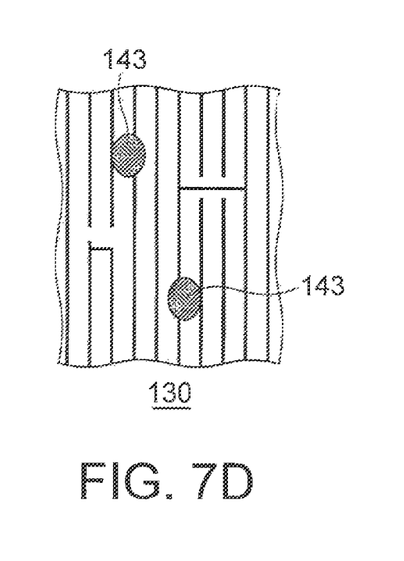
FIG. 7D is a plan view showing concave and convex patterns of the enlarged copy template 130 from which the novel defects are eliminated.

FIG. 7A is a plan view showing concave and convex patterns (the first patterns) transferred onto the copy template 120. FIG. 7B is a plan view showing enlarged concave and convex patterns (second patterns) of the enlarged copy template 130. FIG. 7C is a plan view showing prediction positions of novel defects in the enlarged copy template 130. FIG. 7D is a plan view showing concave and convex patterns of the enlarged copy template 130 from which the novel defects are eliminated.

A case where there are defects in the concave and convex patterns of the master template 100 is considered. In this case, defects 141 are transferred also onto the concave and convex patterns of the copy template 120 as shown in FIG. 7A. The defects 141 are defects such as a missing part of a line portion and a missing part of a space portion in the master template 100.

As shown in FIG. 7B, by enlarging the copy template 120 by stretching or expanding, the defects 141 appear as enlarged defects 143 in the concave and convex patterns of the enlarged copy template 130. Because the enlarged defects 143 are enlarged to be larger than the defects 141, the enlarged defects 143 can be found easily and optically by the pattern inspection apparatus 1. The pattern inspection apparatus 1 detects the defects 141 in the master template 100 by detecting the enlarged defects 143 of the enlarged copy template 130.

Meanwhile, when the copy template 120 is enlarged by stretching, new defects (novel defects) 145 may occur in the concave and convex patterns of the copy template 120. If there are many novel defects 145 not having been included in the master template 100 or in the copy template 120 before enlargement but having newly occurred in the enlarged copy template 130, it becomes difficult to detect the defects 141 in the concave and convex patterns of the master template 100.

The pattern inspection apparatus 1 according to the first embodiment thus eliminates the prediction positions (147 in FIG. 7C) of the novel defects in the enlarged copy template 130 obtained by a simulation from the divergent portions between the reference image and the captured image. For example, the divergent portions between the reference image and the captured image also include the novel defects 145 as well as the enlarged defects 143 as shown in FIG. 7B. The determination output part 60 according to the first embodiment eliminates the coordinates of the novel defects 145 from the coordinates of the divergent portions between the reference image and the captured image and outputs the coordinates of the enlarged defects 143 as defects in the patterns of the master template 100. In this way, the pattern inspection apparatus 1 can eliminate the novel defects 145 from the concave and convex patterns of the enlarged copy template 130 shown in FIG. 7B and can detect the enlarged defects 143 in the concave and convex patterns of the enlarged copy template 130 as shown in FIG. 7D.

Figure 8:
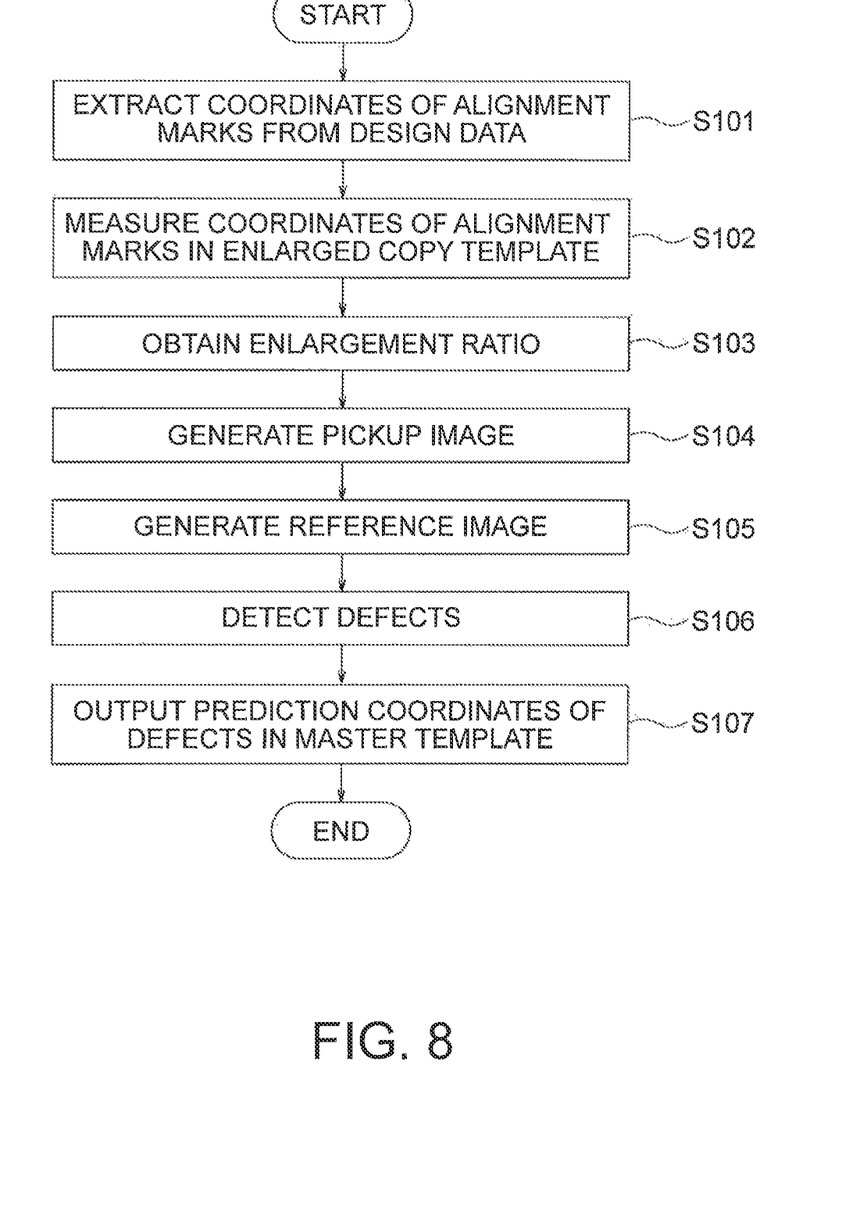
FIG. 8 is a flowchart showing an example of a pattern inspection method performed using the pattern inspection apparatus 1.

FIG. 8 is a flowchart showing an example of a pattern inspection method performed using the pattern inspection apparatus 1.

First, the computing part 41 extracts coordinates of the alignment marks 102 from the design data of the master template 100 (Step S101).

Next, the enlarged copy template 130 is placed on the XY stage 13 and coordinates of the alignment marks 102 in the enlarged copy template 130 are measured (Step S102).

Subsequently, the computing part 41 obtains the enlargement ratio of the enlarged copy template 130 using the coordinates of the alignment marks 102 in the master template 100 and the coordinates of the alignment marks in the enlarged copy template 130 (Step S103). The rotation angle, the orthogonality, the skew, and the like as well as the enlargement ratio can be obtained. The enlargement ratio, the rotation angle, and the like of the enlarged copy template 130 are used to adapt the size, the angle, and the like of the design data to those of the concave and convex patterns of the enlarged copy template 130.

Next, the image capture 10 captures an image of the enlarged copy template 130 and the sensor circuit 30 generates a captured image (Step S104). The generator 50 obtains the design data of the master template 100 from the storage part 40 and generates a reference image from the design data (Step S105).

Subsequently, the determination output part 60 generates a difference image between the captured image and the reference image and detects defects from the difference image (Step S106).

Figure 9:
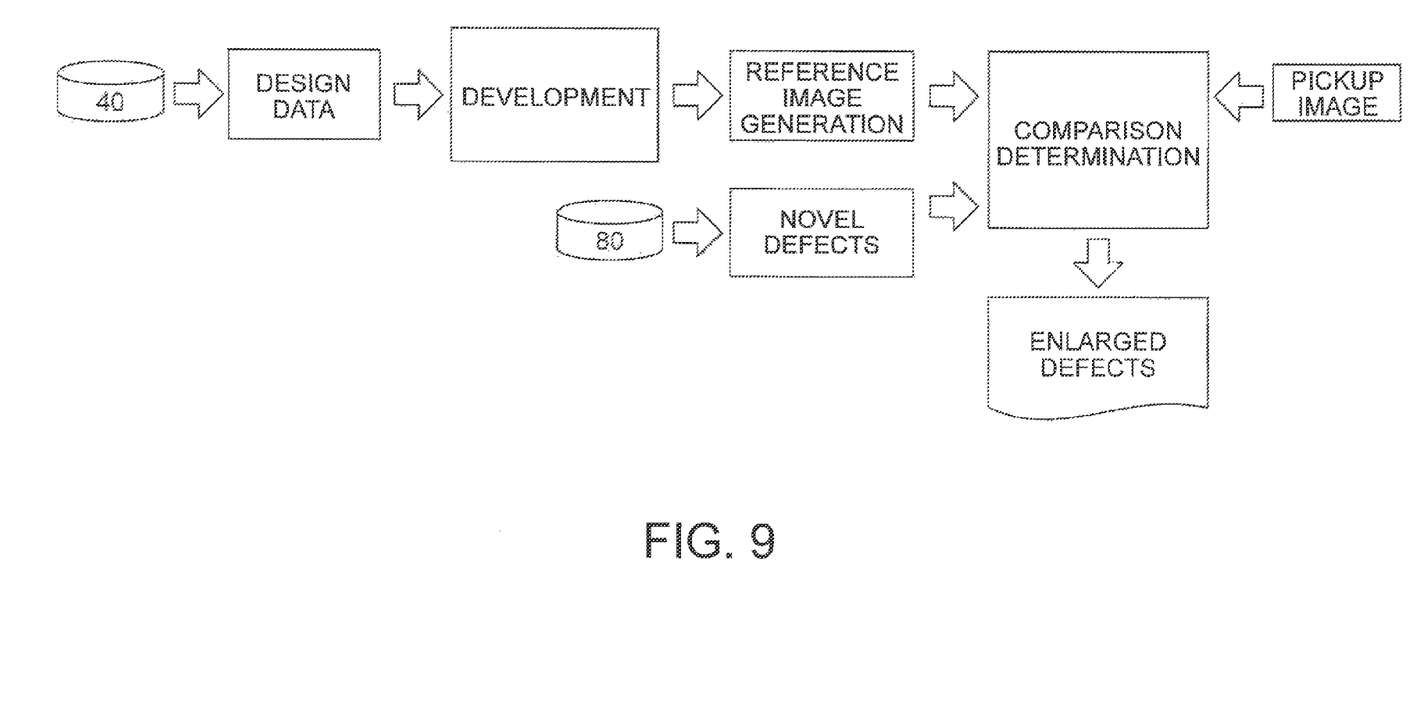
FIG. 9 is an image diagram showing an example of generation of a reference image and defect detection.

Defect detection performed by the determination output part 60 is explained here. FIG. 9 is an image diagram showing an example of generation of a reference image and defect detection. As described above, the computing part 41 or the generator 50 modifies the design data obtained from the storage part 40 using the enlargement ratio, the rotation angle, and the like of the enlarged copy template 130, to be adapted to the size, the angle, and the like of the concave and convex patterns of the enlarged copy template 130. The modified design data is converted into the reference image by the generator 50. The reference image is output to the determination output part 60.

Meanwhile, the determination output part 60 obtains the captured image from the A/D converter 70. The determination output part 60 also obtains the coordinates of the prediction positions of the novel defects from the storage part 80.

The determination output part 60 compares the captured image with the reference image and detects coordinates of divergent portions therebetween. The determination output part 60 then eliminates the coordinates of the prediction positions of the novel defects from the coordinates of the divergent portions between the reference image and the captured image. The determination output part 60 detects the coordinates of the divergent portions except for the coordinates of the prediction positions of the novel defects as the coordinates of the enlarged defects.

Referring back to FIG. 8, coordinates of defects in the master template 100 are output based on the coordinates of the enlarged defects detected at Step S106 (Step S107). The pattern inspection apparatus 1 can output the coordinates of the enlarged defects in the enlarged copy template 130 as well as the coordinates of the defects in the master template 100. The coordinates of the defects in the master template 100 can be calculated from the coordinates of the enlarged defects in the enlarged copy template 130 and the enlargement ratio obtained at Step S103. The coordinates of the defects in the master template 100 can be calculated by an external device based on the coordinates of the enlarged defects output from the determination output part 60.

By outputting the coordinates of the defects in the master template 100 in this way, a defect review with a SEM (Scanning Electron Microscope) can be performed or the defects in the master template 100 can be corrected using an electron-beam correction device.

The pattern inspection apparatus 1 according to the first embodiment determines the divergent portions (inconsistent portions) between the reference image generated from the design data and the captured image, other than the prediction positions of the novel defects 147 occurring due to enlargement of the copy template 120 as the enlarged defects 145. Therefore, the novel defects 147 not having been included in the master template 100 and having newly occurred in the enlarged copy template 130 can be eliminated from the inspection result. As a result, the pattern inspection apparatus 1 can accurately detect the defects in the fine patterns of the master template 100.

In the first embodiment, the defect inspection of a data comparison type in which the captured image of the enlarged copy template 130 and the reference image obtained from the design data of the master template 100 are compared with each other has been explained. However, when a plurality of dies having the same patterns are arranged in an inspection region, the first embodiment is also applicable to a defect inspection of a die comparison type in which the patterns of the dies are compared with each other.

In the first embodiment, the copy template 120 is enlarged by heating and stretching. However, the copy template 120 can be enlarged by immersing the copy template 120 into an organic solvent and causing the copy template 120 to absorb the organic solvent and to expand. Alternatively, the copy template 120 can be enlarged by including a foaming ingredient such as an azo compound in the liquid resin 110 and expanding the liquid resin 110 through foaming.

Second Embodiment

Figure 10:
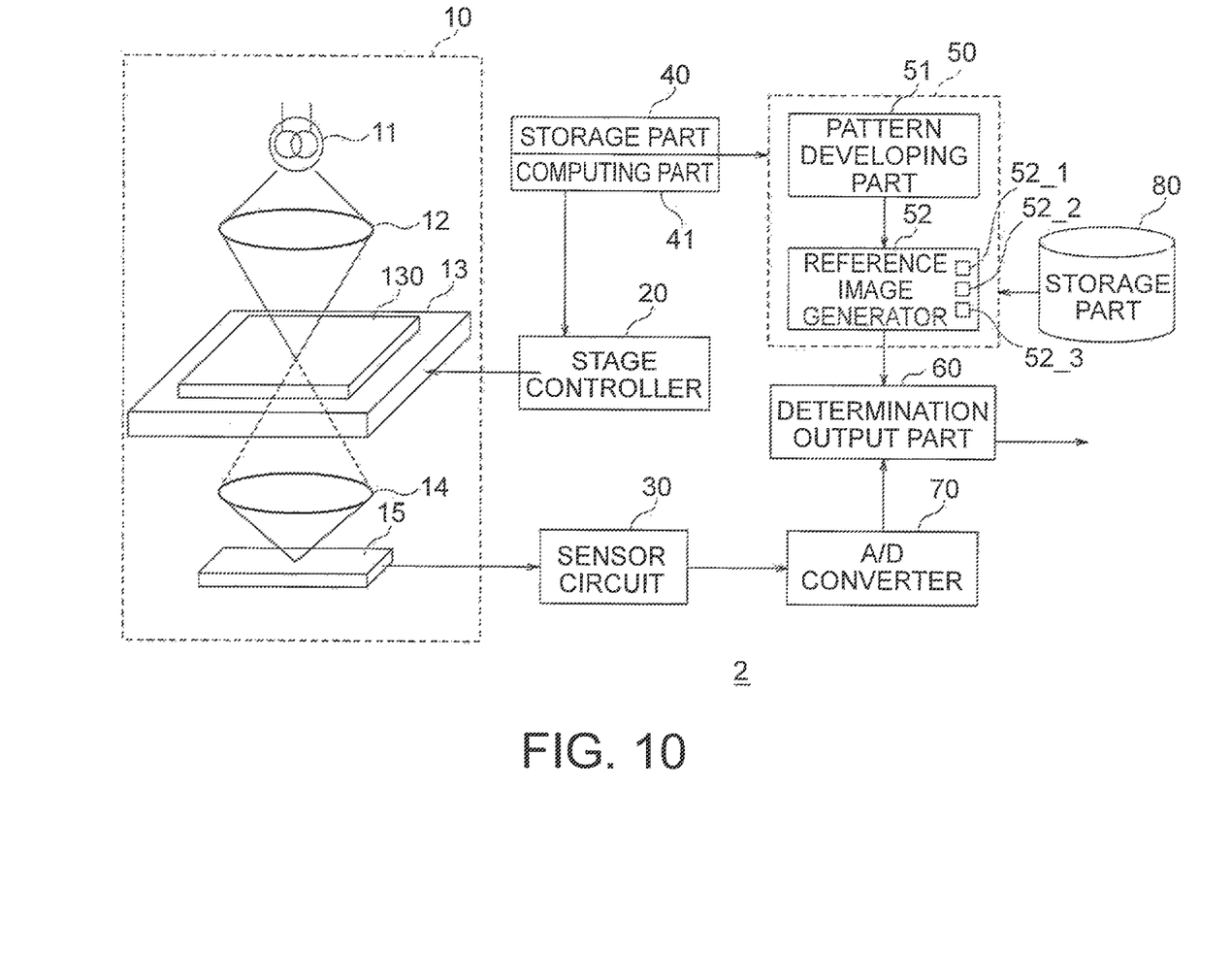
FIG. 10 is a block diagram showing an example of a configuration of a pattern inspection apparatus 2 according to a second embodiment.

FIG. 10 is a block diagram showing an example of a configuration of a pattern inspection apparatus 2 according to a second embodiment. In the second embodiment, the information of the novel defects obtained from the storage part 80 is input to generator 50 rather than the determination output part 60. The information of the novel defects obtained from the storage part 80 is prediction pattern data of the novel defects in the design data. The prediction pattern data is stored in the storage part 80 in the same data format as that of the design data. Details of the prediction pattern data are explained later.

The generator 50 develops the prediction pattern data similarly to the design data and generates a modification reference image (a second reference image) previously containing the novel defects based on the developed prediction pattern data and the developed design data. The determination output part 60 compares the modification reference image and the captured image with each other and detects divergent portions (inconsistent portions) between the modification reference image and the captured image as the defects in the master template 100.

In the second embodiment, the modification reference image previously containing the novel defects and the captured image are thus compared with each other. Therefore, the novel defects are not detected as the defects in the master template 100 because the modification reference image and the captured image almost match in the portions of the novel defects. Accordingly, the second embodiment can accurately detect the defects in the master template 100. Other configurations and operations of the second embodiment can be identical to corresponding ones of the first embodiment.

Figure 11:
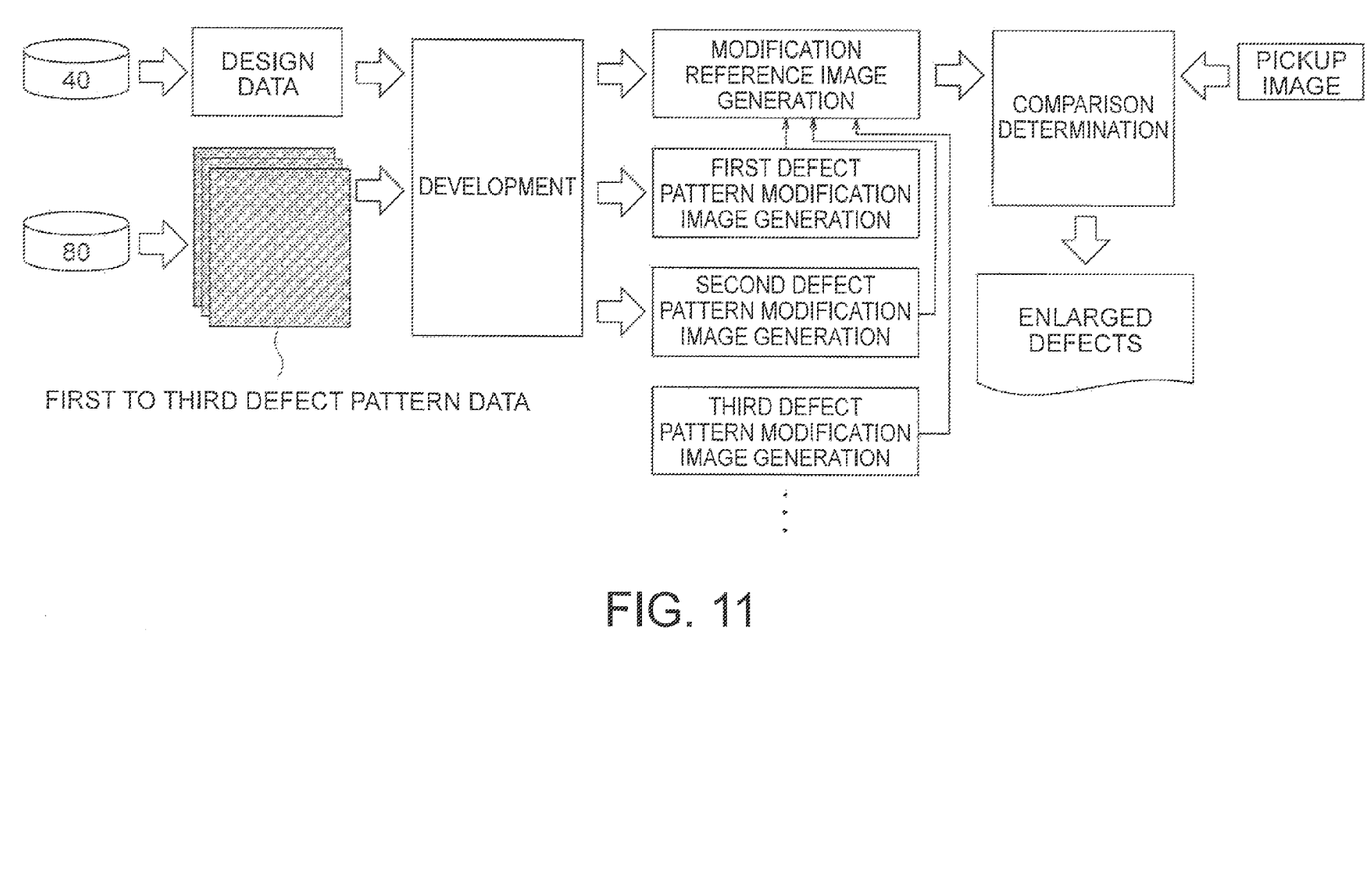
FIG. 11 is an image diagram showing an example of generation of a modification reference image and defect detection.

FIG. 11 is an image diagram showing an example of generation of a modification reference image and defect detection. The computing part 41 and the generator 50 modify the design data obtained from the storage part 40 using the enlargement ratio, the rotation angle, and the like of the enlarged copy template 130, to be adapted to the size, the angle, and the like of the concave and convex patterns of the enlarged copy template 130. The modified design data is developed by the generator 50 to be a reference image (a first reference image).

Meanwhile, the generator 50 receives defect pattern data from the storage part 80. The defect pattern data is pattern data in which the novel defects occurring in the enlarged copy template 130 due to enlargement are classified according to defect types (defect modes).

Figure 12A:
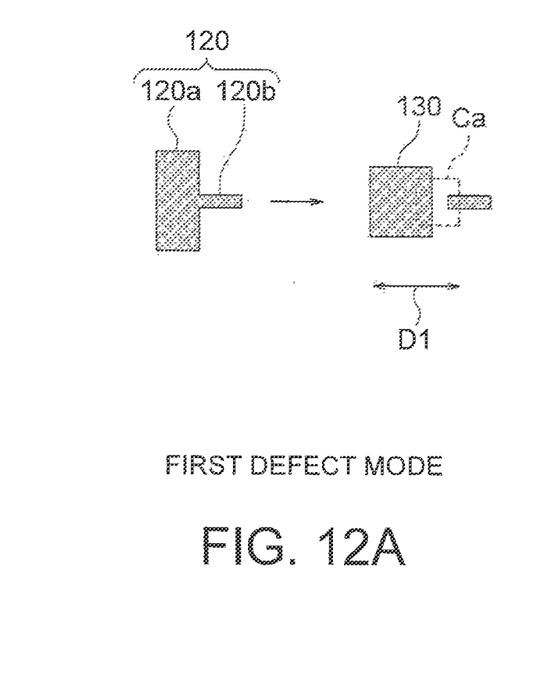
FIGS. 12A to 12C are explanatory diagrams showing an example of defect modes of novel defects.
Figure 12B:
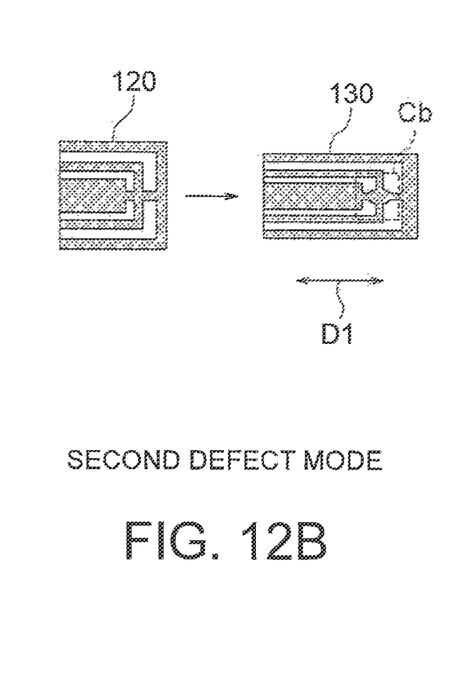
Figure 12C:
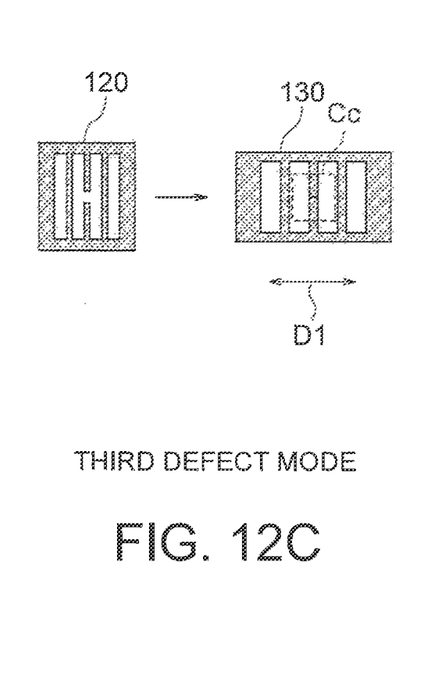

FIGS. 12A to 12C are explanatory diagrams showing an example of defect modes of novel defects. For example, as shown in FIG. 12A, when the copy template 120 having a pattern 120b (not shown) connected to a pattern 120a is enlarged in a direction D1, a state where a pattern in a frame Ca of the enlarged copy template 130 is separated (disconnected) occurs. The mode of such a defect separated (disconnected) due to enlargement is referred to as "first defect mode". As shown in FIG. 12B, when the copy template 120 is enlarged in the direction D1, a state where portions of patterns meeting up with each other in a frame Cb of the enlarged copy template 130 are deformed to be rounded off occurs. The mode of such a defect deformed due to enlargement is referred to as "second defect mode". As shown in FIG. 12C, when the copy template 120 having patterns separated from each other is enlarged in the direction D1, the patterns are in contact with each other in a frame Cc of the enlarged copy template 130. The mode of such a defect in which separated patterns are brought into contact with each other due to enlargement is referred to as "third defect mode".

In the first defect mode, patterns originally connected to each other in the copy template 120 are disconnected in the enlarged copy template 130. In this case, gradation data of the image has a large peak at the disconnected portion. This is because there is no pattern at the disconnected portion and thus the color strength or brightness greatly changes at the disconnected portion relative to portions including patterns.

Conversely, in the third defect mode, patterns originally separated from each other in the copy template 120 are connected in the enlarged copy template 130. In this case, gradation data of the image loses a peak at the connected portion.

In the second defect mode, the patterns are deformed in the enlarged copy template 130. In this case, in gradation data of the image, the position of a peak or the region of a peak changes at the deformed portion. In this way, a change in the gradation data of the image can be predicted to some extent according to the defect mode.

In the second embodiment, the first defect pattern data contains the coordinates of prediction positions in the first defect mode obtained by an elastic deformation simulation or a plastic deformation simulation. The second defect pattern data contains the coordinates of prediction positions in the second defect mode obtained by the simulation mentioned above.

The third defect pattern data contains the coordinates of prediction positions in the third defect mode obtained by the simulation mentioned above. The number of defect modes (the number of classifications) is not limited to three and two or less defect modes or four or more defect modes can be provided. It suffices to provide modification image generators (logic circuits) as many as the number of the defect modes (the number of the classifications of defect pattern data).

Referring back to FIG. 11, operations of the generator 50 and the determination output part 60 are explained next.

The pattern developing part 51 receives the first to third defect pattern data from the storage part 80 and develops each of the first to third pattern data similarly to the design data.

The reference image generator 52 includes first to third modification image generators 52_1 to 52_3 corresponding to the first to third pattern data, respectively. The first to third modification image generators 52_1 to 52_3 can be logic circuits corresponding to the first to third defect modes, respectively. The first to third modification image generators 52_1 to 52_3 convert the developed first to third defect pattern data into multivalued gradation data, respectively. The first to third modification image generators 52_1 to 52_3 thus generate the first to third defect pattern modification images, respectively. In this way, the reference image generator 52 converts the developed first to third defect pattern data individually into the multivalued gradation data.

The first to third defect pattern data are classified into the first to third defect modes mentioned above, respectively, which enables methods of modifying the gradation data to be shared. For example, in the first defect pattern modification image, gradation data of a modification portion is greatly shifted from gradation data of the surrounding portions to cause the gradation data of the modification portion to have a large peak. At this time, it suffices that the peak of the gradation data of the modification portion is an identical peak to that of gradation data of a portion where patterns are disconnected from each other.

In the third defect pattern modification image, gradation data of a modification portion is matched to gradation data of the surrounding portions to cause the gradation data of the modification portion not to have a peak. At this time, it suffices that the gradation data of the modification portion is identical to that of portions including patterns.

In the second defect pattern modification image, the region of gradation data of a modification portion is changed. At this time, it suffices that the gradation data of the modification portion is changed to expand or narrow the region of gradation data of portions including patterns.

It is preferable that pieces of defect pattern data having the same defect mode are processed by the same logic circuit. For example, the first modification image generator 52_1 in the generator 50 processes the developed first defect pattern data and generates the first defect pattern modification image. The second modification image generator 52_2 in the generator 50 processes the developed second defect pattern data and generates the second defect pattern modification image. The third modification image generator 52_3 in the generator 50 processes the developed third defect pattern data and generates the third defect pattern modification image. As mentioned above, the first to third modification image generators 52_1 to 52_3 are constituted by the logic circuits, respectively.

Accordingly, the first to third modification image generators 52_1 to 52_3 can generate the first to third defect pattern modification images, respectively, at a high speed.

Next, the generator 50 incorporates the first to third defect pattern modification images as modification images generated by the first to third modification image generators 52_1 to 52_3, respectively, into the first reference image generated from the design data. That is, the generator 50 modifies (updates or rewrites) gradation data of the corresponding portions in the first reference image using the gradation data of the modification portions of the first to third defect pattern modification images. The second reference image previously containing the novel defects is thus generated. That is, the second reference image is a reference image having gradation data identical to that of the novel defects at the prediction portions of the novel defects.

The determination output part 60 then compares the captured image obtained from the A/D converter 70 with the second reference image and detects the coordinates of the divergent portions therebetween. In the second embodiment, the determination output part 60 detects the coordinates of the divergent portions between the second reference image and the captured image as the coordinates of the enlarged defects. At this time, the modification reference image and the captured image almost match in the portions of the novel defects and thus the novel defects are not detected as the defects in the master template 100. That is, because the modification reference image previously contains the image of the novel defects having occurred due to enlargement of the copy template 120, the determination output part 60 does not need to eliminate the prediction positions of the novel defects from the divergent portions and can simply output the divergent portions as the coordinates of the enlarged defects. Accordingly, the second embodiment can accurately detect the defects in the master plate 100. Other configurations and operations of the second embodiment can be identical to corresponding ones of the first embodiment.

As described above, the pattern inspection apparatus 2 generates the modification reference image obtained by previously including the image of the novel defects in the first reference image generated from the design data and compares the modification reference image with the captured image to detect the enlarged defects. Even with such configurations, the second embodiment can obtain effects identical to those in the first embodiment.

In the second embodiment, the generator 50 converts the first to third prediction pattern data in the same data format as that of the design data, thereby generating the first to third defect pattern modification images. However, the storage part 80 can have the first to third defect pattern modification images previously stored therein and supply the first to third defect pattern modification images to the generator 50. Because this eliminates the need for the generator 50 to convert the prediction pattern data, the circuit scale of the generator 50 can be reduced or the load on the generator 50 can be reduced.

Modification of the Second Embodiment

In the modification of the second embodiment, the determination output part 60 removes in advance the image data of the novel defects from the comparison when comparing the captured image with the modification reference image. That is, the determination output part 60 uses the image data of the novel defects as data for masking the captured image. Accordingly, the determination output part 60 can remove the prediction portions of the novel defects from the divergent portions without comparing the modification reference image with the captured image with regard to the portions of the novel defects. In the modification, the image data of the novel defects may be identical data (common data) for masking. The image data of the novel defects does not need to be made to be different for each novel defect.

Thus, the modification can have the same advantages of the second embodiment by removing the image data of the novel defects from the comparison. In the modification, the first to third modification image generators 52_1 to 52_3 may be omitted, since the image data of the novel defects is unnecessary to be made to be different for each novel defect.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern inspection apparatus comprising:
   an image capture capturing an image of a second pattern of an inspection target object obtained by enlarging the inspection target object having a first pattern; and
   an output part outputting position information of the first or second pattern corresponding to divergent portions between a reference data generated from design data of the first pattern and a captured data generated by the image capture, other than prediction positions of first defects occurring when the inspection target object is enlarged,
   wherein the prediction positions of the first defects are determined using an elastic deformation simulation or a plastic deformation simulation.

2. The apparatus of claim 1, further comprising a storage part storing information of the prediction positions of the first defects.

3. The apparatus of claim 1, wherein the prediction positions of the first defects are determined by adding a modification to a result obtained using the elastic deformation simulation or the plastic deformation simulation.

4. The apparatus of claim 1, further comprising an input part inputting information of the prediction positions of the first defects from outside of the pattern inspection apparatus.

5. The apparatus of claim 1, wherein the inspection target object is enlarged in one direction or in two directions orthogonal to each other in a plane including the first or the second pattern.

6. The apparatus of claim 1, wherein the inspection target object is enlarged in all directions in a plane including the first or the second pattern.

7. A pattern inspection apparatus comprising:
an image capture capturing an image of a second pattern of an inspection target object obtained by enlarging the inspection target object having a first pattern;
a generator generating a second reference data by including data of first defects in a first reference data, the first defects being predicted to occur due to enlargement of the inspection target object, the first reference data being generated from design data of the first pattern; and
an output part outputting position information of the first or second pattern corresponding to divergent portions between the second reference data and a captured data generated by the image capture, other than prediction positions of first defects occurring when the inspection target object is enlarged.

8. The apparatus of claim 7, wherein the output part removes the prediction positions of the first defects from the divergent portions comparing the captured data with the second reference data.

9. The apparatus of claim 7, wherein the output part removes the prediction positions of the first defects from the divergent portions removing the first defects for comparison when comparing the captured data with the second reference data.

10. The apparatus of claim 7, wherein the generator generates modification data with respect to types of the first defects, respectively, and generates the second reference data by modifying the first reference data using the modification data.

11. The apparatus of claim 10, wherein the generator uses the modification data for portions of the first defects in the first reference data.

12. The apparatus of claim 7, further comprising a storage part storing information of the prediction positions of the first defects.

13. The apparatus of claim 7, wherein the prediction positions of the first defects are determined using an elastic deformation simulation or a plastic deformation simulation.

14. A pattern inspection method performed using a pattern inspection apparatus comprising an image capture capturing an image of an inspection target object having a first pattern, and an output part outputting position information of defects in the first pattern, the method comprising:
capturing an image of a second pattern of the inspection target object obtained by enlarging the inspection target object; and
outputting position information of the first or second pattern corresponding to divergent portions between a reference data generated from design data of the first pattern and a captured data generated by the image capture, other than prediction positions of first defects occurring when the inspection target object is enlarged, or
generating a second reference data by including data of the first defects in a first reference data generated from design data of the first pattern, and outputting position information of the first or second pattern corresponding to divergent portions between the second reference data and the captured data generated by the image capture.

15. The method of claim 14, further comprising:
generating the prediction positions of the first defects using an elastic deformation simulation or a plastic deformation simulation; and
storing the prediction positions of the first defects.

16. The method of claim 14, further comprising inputting the prediction positions of the first defects from outside of the pattern inspection apparatus.

17. The method of claim 14, wherein the prediction positions of the first defects are determined by adding a modification to a result obtained using the elastic deformation simulation or the plastic deformation simulation.

18. The method of claim 14, wherein the second reference data is generated by modifying the first reference data using modification data, the modification data being generated with respect to types of the first defects, respectively.

19. The method of claim 18, wherein the second reference data is generated using the modification data for portions of the first defects in the first reference data.

* * * * *